(12) United States Patent
Fukushima et al.

(10) Patent No.: US 12,167,580 B2
(45) Date of Patent: Dec. 10, 2024

(54) COOLING SYSTEM

(71) Applicant: DENSO CORPORATION, Kariya (JP)

(72) Inventors: Kazuma Fukushima, Kariya (JP);
Tomohisa Sano, Kariya (JP)

(73) Assignee: DENSO CORPORATION, Kariya (JP)

( * ) Notice: Subject to any disclaimer, the term of this patent is extended or adjusted under 35 U.S.C. 154(b) by 283 days.

(21) Appl. No.: 17/898,024

(22) Filed: Aug. 29, 2022

(65) Prior Publication Data

US 2022/0418171 A1 Dec. 29, 2022

Related U.S. Application Data

(63) Continuation of application No. PCT/JP2021/005724, filed on Feb. 16, 2021.

(30) Foreign Application Priority Data

Feb. 28, 2020 (JP) .................................. 2020-033172

(51) Int. Cl.
*H05K 7/20* (2006.01)
*H02K 9/00* (2006.01)

(52) U.S. Cl.
CPC ........... *H05K 7/20945* (2013.01); *H02K 9/00* (2013.01)

(58) Field of Classification Search
CPC .......... B60L 15/20; B60L 3/003; B60L 1/003; B60K 6/445; B60K 1/00; B60K 11/02; Y02T 10/62; Y02T 10/64; Y02T 10/72; H02P 27/06; H02P 27/08; H02P 21/22; H02P 21/14; H02K 7/14; H02K 1/193; H02K 1/32; H02K 1/20; H02K 9/16; H02K 9/19; H02K 9/18; H02K 9/197; H02K 9/20; H02K 9/06; H02K 9/14
See application file for complete search history.

(56) References Cited

U.S. PATENT DOCUMENTS

2017/0259695 A1* 9/2017 Ishikawa ........... B60W 50/0225

FOREIGN PATENT DOCUMENTS

| JP | 2005-348535 A | 12/2005 |
|----|---------------|---------|
| JP | 2013-158181 A | 8/2013 |
| JP | 2016-208686 A | 12/2016 |

* cited by examiner

*Primary Examiner* — Bryan R Perez
(74) *Attorney, Agent, or Firm* — Oliff PLC

(57) ABSTRACT

Disclosed is a cooling system for cooling an electric drive system. The electric drive system includes a motor and an inverter configured to drive the motor. The cooling system includes a first cooler, a second cooler, a circulating flow passage and a pump. The first cooler is configured to cool the motor by heat exchange using a coolant flowing through the first cooler. The second cooler is configured to cool the inverter by heat exchange using the coolant flowing through the second cooler. The circulating flow passage passes through both the first and second coolers, and the coolant circulates in the circulating flow passage. The pump is arranged in the circulating flow passage to pump the coolant.

2 Claims, 3 Drawing Sheets

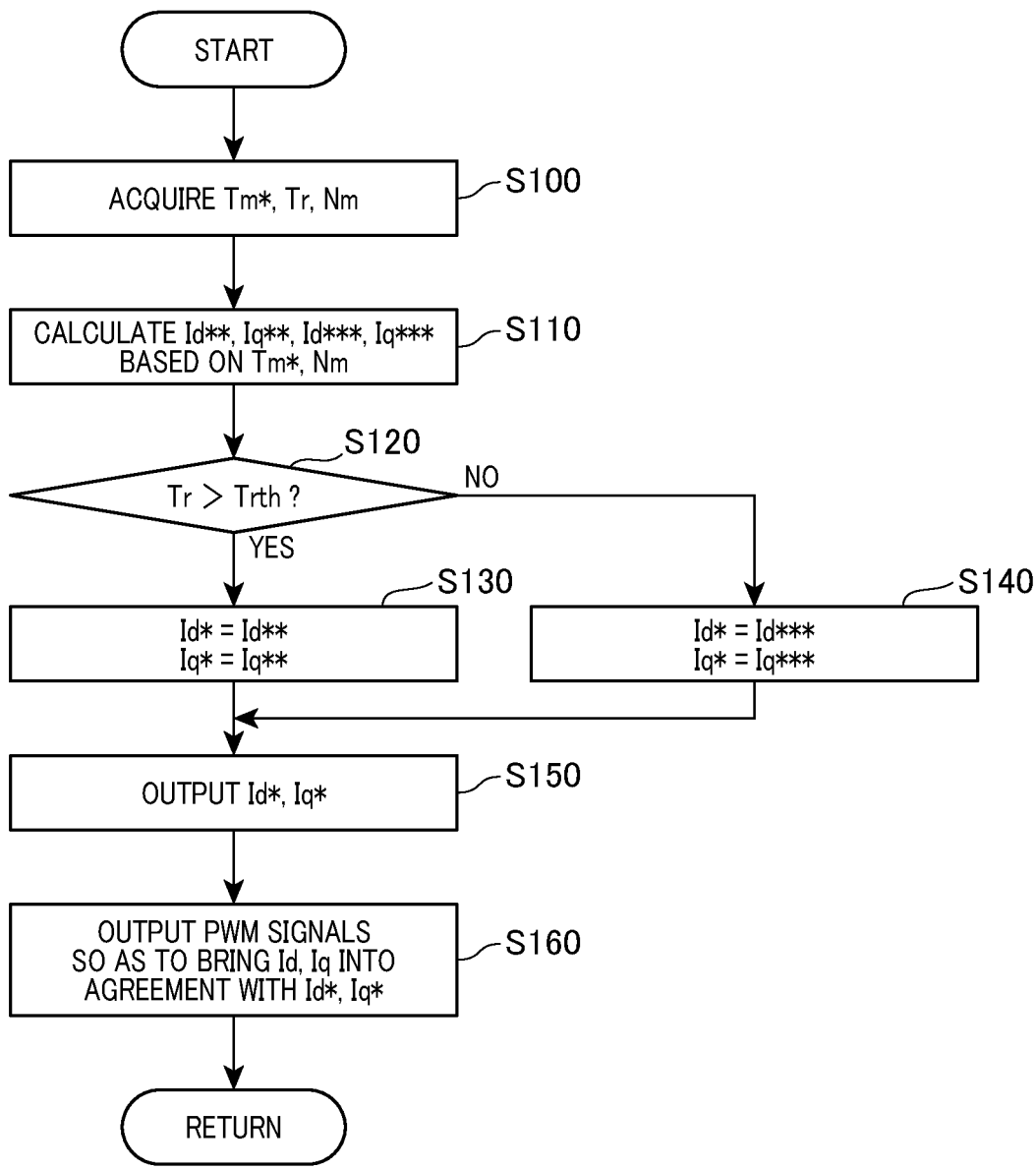

COOLING SYSTEM

CROSS-REFERENCE TO RELATED APPLICATIONS

The present application is a continuation application of International Application No. PCT/JP2021/005724 filed on Feb. 16, 2021, which is based on and claims priority from Japanese Patent Application No. 2020-033172 filed on Feb. 28, 2020. The entire contents of these applications are incorporated by reference into the present application.

BACKGROUND

1 Technical Field

The present disclosure relates to cooling systems.

2 Description of Related Art

Conventionally, various cooling systems have been proposed for cooling, for example, motors.

SUMMARY

According to the present disclosure, there is provided a cooling system for cooling an electric drive system. The electric drive system includes a motor and an inverter configured to drive the motor. The inverter includes switching elements. The cooling system includes: a first cooler configured to cool the motor by heat exchange using a coolant flowing through the first cooler; a second cooler configured to cool the inverter by heat exchange using the coolant flowing through the second cooler; a circulating flow passage which passes through both the first and second coolers and in which the coolant circulates; a pump arranged in the circulating flow passage to pump the coolant; an inverter controller configured to output control signals to the switching elements according to a target torque of the motor and thereby control an output electric power of the inverter; and a temperature sensor configured to detect a coolant temperature which is a temperature of the coolant circulating in the circulating flow passage. When the coolant temperature detected by the temperature sensor is lower than or equal to a predetermined threshold temperature, the inverter controller outputs the control signals and thereby controls the switching elements so as to increase, with variation in an output torque of the motor with respect to the target torque kept within a predetermined variation range, both an amount of heat generated by the motor and an amount of heat generated by the inverter. The inverter controller is configured to: acquire a motor current, which is electric current flowing through the motor and composed of a d-axis current and a q-axis current, from a current sensor that detects the motor current; acquire a rotational speed of the motor from a rotational speed sensor that detects the rotational speed; calculate, based on both the target torque and the acquired rotational speed, a d-axis current candidate value that is a candidate value for a d-axis current target value, a d-axis warming-up current candidate value, a q-axis current candidate value that is a candidate value for a q-axis current target value, and a q-axis warming-up current candidate value; determine whether the coolant temperature detected by the temperature sensor is lower than or equal to the predetermined threshold temperature; set the d-axis and q-axis current target values respectively to the d-axis and q-axis current candidate values when the coolant temperature is determined to be higher than the predetermined threshold temperature; set the d-axis and q-axis current target values respectively to the d-axis and q-axis warming-up current candidate values when the coolant temperature is determined to be lower than or equal to the predetermined threshold temperature; and set the control signals so as to bring the d-axis and q-axis currents respectively into agreement with the d-axis and q-axis current target values. The d-axis warming-up current candidate value is larger than the d-axis current candidate value. The difference between the d-axis warming-up current candidate value and the d-axis current candidate value is larger than the difference between the q-axis warming-up current candidate value and the q-axis current candidate value.

BRIEF DESCRIPTION OF THE DRAWINGS

FIG. 4 is a flowchart illustrating a motor control process according to the exemplary embodiment.

DESCRIPTION OF EMBODIMENTS

Figure 1:
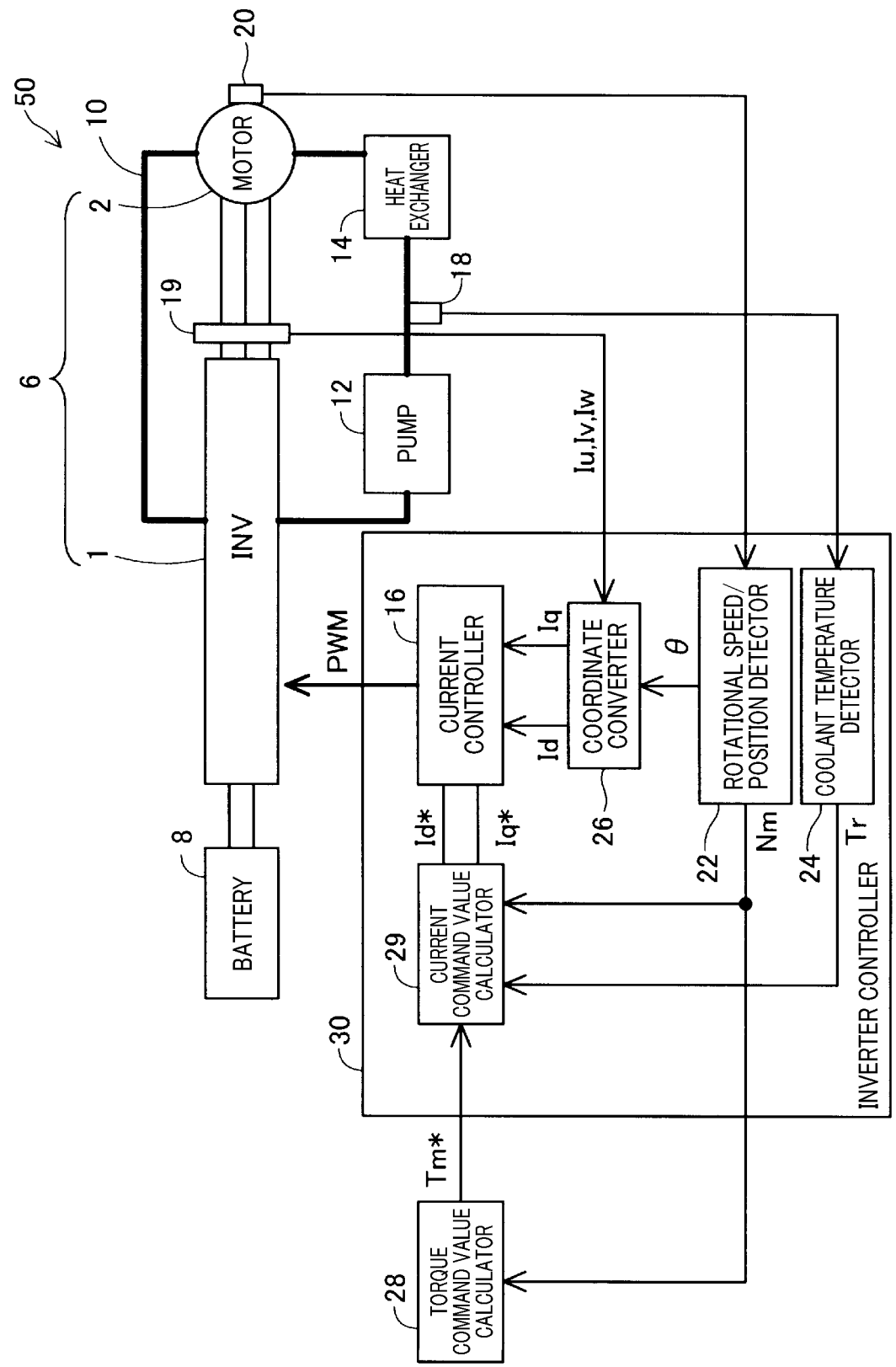
FIG. 1 is a block diagram of both an electric drive system and a cooling system according to an exemplary embodiment.

Japanese Patent Application Publication No. JP2005-348535A discloses a cooling system that has an oil passage passing through a motor and an oil pump for pumping cooling oil flowing through the oil passage. The cooling system is configured to cool the motor with the cooling oil flowing through the oil passage. Moreover, in the cooling system, there is provided a motor controller that includes an inverter. When the temperature of the cooling oil is lower than or equal to a predetermined threshold temperature, the motor controller controls electric power supply to the motor so as to increase the copper loss of the motor, thereby heating the cooling oil and thus lowering the viscosity of the cooling oil. Consequently, the flow rate of the cooling oil can be secured even at low temperatures.

With electrification of moving objects and the like, electric drive systems (generally abbreviated to EDSs), which typically include a motor and an inverter, have been used in various applications. For example, electric drive systems are used to rotationally drive rotary wings of electric aircraft, screw propellers of ships and wheels of automobiles. Electric aircraft include, for example, manned or unmanned aircraft called eVTOLs (i.e., electric Vertical Take-Off and Landing aircraft) as well as ordinary take-off and landing aircraft. In electric drive systems, it is desired to cool the inverter as well as the motor. However, in the cooling system disclosed in the above patent document, cooling of the inverter has not been taken into account. Therefore, for cooling both the motor and the inverter, it is necessary to further employ an inverter cooling system in addition to the cooling system designed to cool only the motor. However, in this case, the weight of an electric drive system that employs both the cooling systems would be increased; thus, both the mobility and fuel economy of a moving object that is equipped with the electric drive system would be lowered.

The present disclosure has been accomplished in view of the above problems.

With the configuration of the above-described cooling system according to the present disclosure, both the motor and the inverter can be cooled by the same coolant circulating in the circulating flow passage. Consequently, it becomes possible to reduce the weights of the flow passage and the coolant and thereby suppress increase in the weight of the entire cooling system as compared with a cooling system where two coolant flow passages are separately formed to respectively cool a motor and an inverter.

Moreover, with the configuration of the above-described cooling system according to the present disclosure, when the coolant temperature is lower than or equal to the predetermined threshold temperature, it is possible to increase both the amount of heat generated by the motor and the amount of heat generated by the inverter while keeping the output torque of the motor close to the target torque. Consequently, it is possible to lower the viscosity of the coolant and thereby secure the flow rate of the coolant even at low temperatures. As a result, it is possible to suppress increase in the size of the pump; it is also possible to prevent the output torque of the motor from considerably deviating from the target torque, thereby suppressing an uncomfortable feeling caused to, for example, a user of a moving object that is equipped with the electric drive system.

In addition, the present disclosure can also be realized in other forms. For example, the present disclosure can be realized in the form of a method of cooling an electric drive system installed in a moving object such as an automobile or an electric aircraft.

Hereinafter, an exemplary embodiment will be described with reference to FIGS. 1 to 4.

As shown in FIG. 1, a cooling system 50 according to the present embodiment is configured to cool an electric drive system 6. The electric drive system 6 includes an inverter 1 and a motor 2. In the present embodiment, the electric drive system 6 is configured to rotationally drive rotary wings of an eVTOL.

Moreover, in the present embodiment, the motor 2 is implemented by a three-phase AC brushless motor. The motor 2 rotates at a rotational speed and torque which depend on a voltage and current supplied from the inverter 1 that will be described later. It should be noted that the motor 2 may alternatively be implemented by other types of motors, such as an induction motor or a reluctance motor. In addition, the motor 2 may also be implemented by a motor-generator that selectively functions either as an electric motor or as an electric generator.

Figure 2:
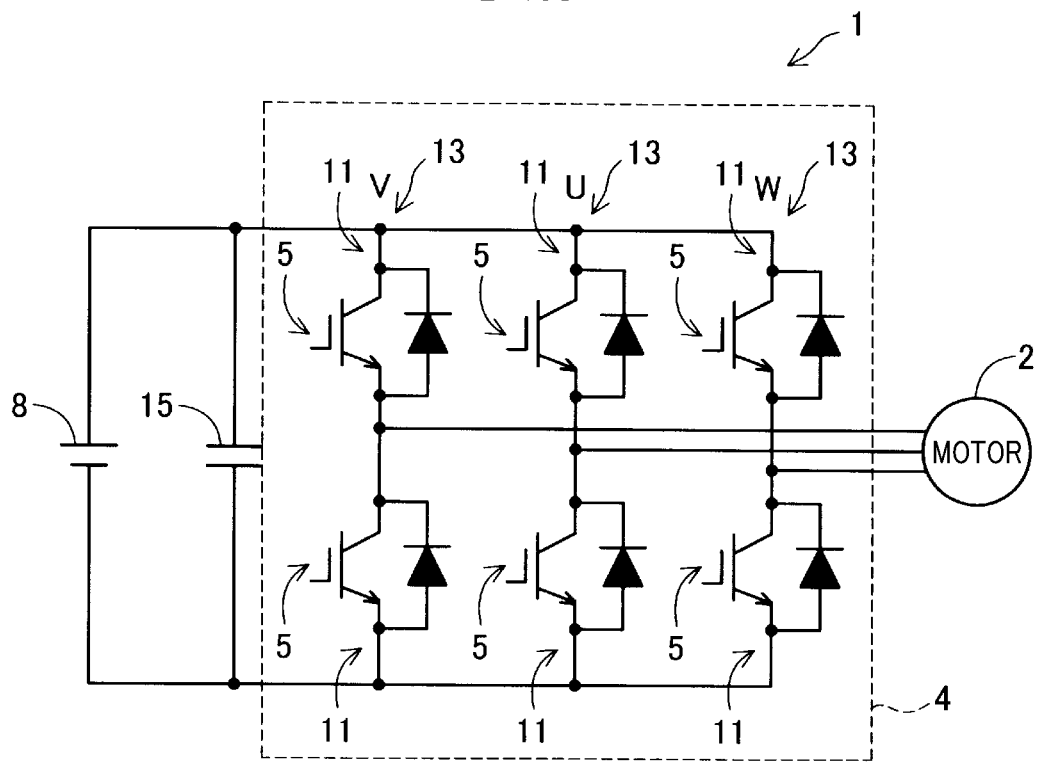
FIG. 2 is a circuit diagram of an inverter for driving a motor in the electric drive system.

As shown in FIG. 2, the inverter 1 is configured to drive the motor 2. Specifically, the inverter 1 is configured to convert a DC voltage supplied from a battery 8 into a three-phase AC voltage and supply the resultant three-phase AC voltage to the motor 2. The inverter 1 includes an inverter circuit 4 that has three legs 13 provided respectively for U, V and W phases. Each of the legs 13 has a pair of upper-arm and lower-arm switching elements 5 connected in series with each other. In addition, the DC voltage supplied from the battery 8 to the inverter circuit 4 is smoothed by a capacitor 15.

In the present embodiment, each of the switching elements 5 is implemented by a semiconductor switching element such as an IGBT (Insulated-Gate Bipolar Transistor).

As shown in FIG. 1, the eVTOL includes the aforementioned battery 8, a current sensor 19, a rotational speed sensor 20 and a torque command value calculator 28 in addition to the electric drive system 6 and the cooling system 50.

The battery 8 is implemented by a lithium-ion battery and functions as an electric power supply source in the electric drive system 6. The battery 8 supplies electric power mainly to a drive unit of the inverter 1 included in the electric drive system 6, thereby driving the motor 2. It should be noted that the battery 8 may alternatively be implemented by other secondary batteries such as a nickel-metal hydride battery. In addition, the eVTOL may include other electric power supply sources, such as a fuel cell or an electric generator, instead of or in addition to the battery 8.

As shown in FIG. 1, the current sensor 19 is mounted to the inverter 1. The current sensor 19 is a three-phase AC current sensor which detects U-phase, V-phase and W-phase currents Iu, Iv and Iw outputted from the inverter 1.

The rotational speed sensor 20 is mounted to the motor 2. The rotational speed sensor 20 measures both the rotational speed Nm and the rotation angle θ of the motor 2. In the present embodiment, the rotational speed sensor 20 is implemented by a resolver. It should be noted that the rotational speed sensor 20 may alternatively be implemented by other types of rotational speed sensors such as a rotary encoder.

The torque command value calculator 28 calculates a torque command value Tm* based on a target torque inputted from a flight controller (not shown) of the eVTOL and the rotational speed Nm of the motor 2 acquired from a rotational speed/position detector 22. Moreover, the torque command value calculator 28 outputs the calculated torque command value Tm* to a current command value calculator 29.

Figure 3:
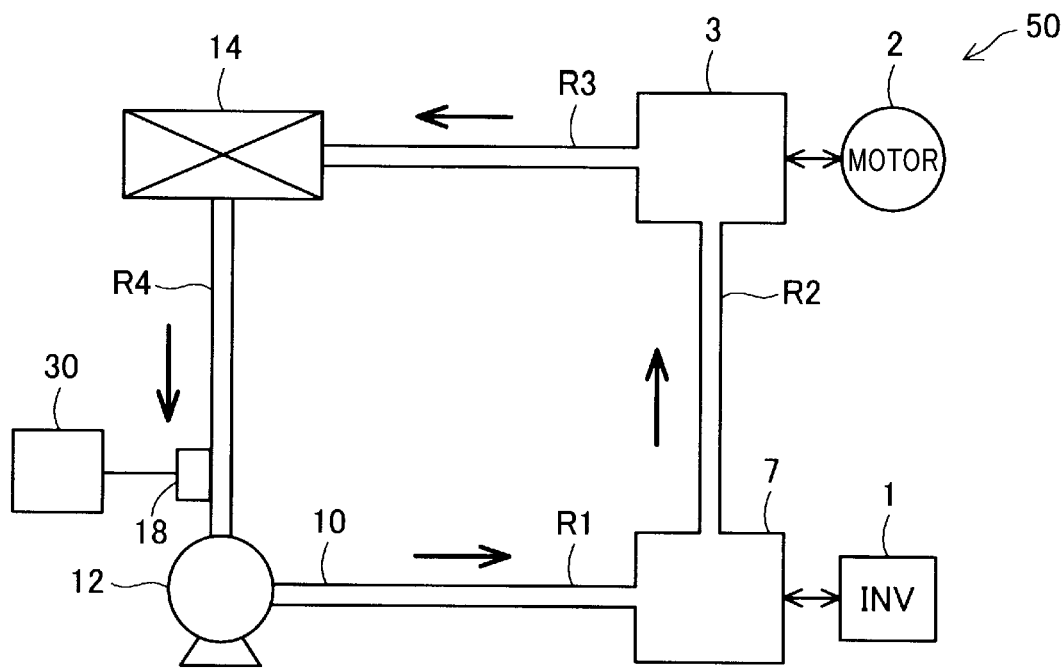
FIG. 3 is a schematic diagram of the cooling system.

As shown in FIG. 3, the cooling system 50 includes a first cooler (or first cooling unit) 3, a second cooler (or second cooling unit) 7, a circulating flow passage 10, a pump 12, a heat exchanger 14, a temperature sensor 18 and an inverter controller 30.

The first cooler 3 is configured to cool heat-generating components of the motor 2 by heat exchange using a coolant flowing through inside of the first cooler 3. In the present embodiment, the coolant is implemented by a Long-Life Coolant (LLC). It should be noted that the coolant may alternatively be implemented by other types of liquids such as cooling oil or pure water, or by gases such as air or nitrogen gas.

The second cooler 7 is configured to cool heat-generating components of the inverter 1 by heat exchange using the coolant flowing through inside of the second cooler 7. The heat-generating components of the inverter 1 include the inverter circuit 4 and the capacitor 15.

As shown in FIG. 3, the circulating flow passage 10 is an annular flow passage which includes a first flow passage R1, a second flow passage R2, a third flow passage R3 and a fourth flow passage R4. In the cooling system 50, the coolant, which is pumped by the pump 12, flows from the pump 12 to the second cooler 7 through the first flow passage R1 and cools the heat-generating components of the inverter 1. Then, the coolant, which flows out of the second cooler 7, further flows to the first cooler 3 through the second flow passage R2 and cools the heat-generating components of the motor 2. Then, the coolant, which flows out of the first cooler 3, further flows to the heat exchanger 14 through the third flow passage R3. Thereafter, the coolant, which flows out of the heat exchanger 14, returns to the pump 12 through the fourth flow passage R4.

The pump 12 is arranged in the circulating flow passage 10, as shown in FIGS. 1 and 3. In the present embodiment, the pump 12 is implemented by an electric pump. The pump 12 is configured to pump, with electric power supplied from an auxiliary battery (not shown), the coolant circulating in the circulating flow passage 10.

The heat exchanger 14 is also arranged in the circulating flow passage 10. The heat exchanger 14 is configured to perform heat exchange between the coolant circulating in the circulating flow passage 10 and air present outside the circulating flow passage 10. That is, the coolant, whose temperature is increased by both the heat exchange thereof with the heat-generating components of the inverter 1 at the second cooler 7 and the heat exchange thereof with the heat-generating components of the motor 2 at the first cooler 3, is cooled when passing through the heat exchanger 14.

As shown in FIGS. 1 and 3, the temperature sensor 18 is arranged in contact with the circulating flow passage 10. The temperature sensor 18 is configured to measure the temperature of the coolant circulating in the circulating flow passage 10 (hereinafter, to be simply referred to as the coolant temperature).

As shown in FIG. 1, the inverter controller 30 includes a current controller 16, the aforementioned rotational speed/position detector 22, a coolant temperature detector 24, a coordinate converter 26 and the aforementioned current command value calculator 29. The inverter controller 30 is implemented by an ECU (Electronic Control Unit) which includes a microprocessor, an FPGA (Field-Programmable Gate Array) or the like.

The current controller 16 controls the inverter circuit 4. Specifically, the torque command value calculator 28 calculates, based on information inputted from a throttle (not shown) or the like, a driving force required for flying and running of the eVTOL. According to the torque command value Tm* outputted from the torque command value calculator 28 and the U-phase, V-phase and W-phase currents Iu, Iv and Iw detected by the current sensor 19, the current controller 16 outputs control signals to the switching elements 5 of the inverter circuit 4, thereby PWM-controlling the output electric power of the inverter circuit 4. Here, PWM stands for Pulse Width Modulation.

The rotational speed/position detector 22 detects both the rotational speed Nm and the rotation angle θ of the motor 2 measured by the rotational speed sensor 20. Moreover, the rotational speed/position detector 22 outputs the detected rotational speed Nm of the motor 2 to both the torque command value calculator 28 and the current command value calculator 29, and outputs the detected rotation angle θ of the motor 2 to the coordinate converter 26.

The coolant temperature detector 24 detects the coolant temperature Tr measured by the temperature sensor 18. Moreover, the coolant temperature detector 24 outputs the detected coolant temperature Tr to the current command value calculator 29.

The coordinate converter 26 acquires the U-phase, V-phase and W-phase currents Iu, Iv and Iw measured by the current sensor 19. Then, the coordinate converter 26 converts, based on the rotation angle θ of the motor 2, the acquired U-phase, V-phase and W-phase currents Iu, Iv and Iw into d-axis and q-axis currents Id and Iq of the motor 2. Thereafter, the coordinate converter 26 outputs the resultant d-axis and q-axis currents Id and Iq of the motor 2 to the current controller 16.

The current command value calculator 29 calculates, by referring to maps created in advance, current command values Id* and Iq* based on the torque command value Tm*, the coolant temperature Tr and the rotational speed Nm of the motor 2. Moreover, the current command value calculator 29 outputs the calculated current command values Id* and Iq* to the current controller 16.

The current controller 16 generates the control signals so as to cause the actual d-axis and q-axis currents Id and Iq of the motor 2 inputted from the coordinate converter 26 to follow the current command values Id* and Iq* inputted from the current command value calculator 29.

FIG. 4 illustrates a motor control process for controlling operation of the motor 2 according to the present embodiment. This process is performed by the inverter controller 30 upon supply of electric power from the battery 8 to the electric drive system 6.

In the motor control process, first, in step S100, the current command value calculator 29 acquires the torque command value Tm*, the coolant temperature Tr and the rotational speed Nm of the motor 2.

Then, in step S110, the current command value calculator 29 calculates, by referring to a torque-current map created in advance, both a d-axis current candidate value Id and a q-axis current candidate value Iq based on the torque command value Tm* and the rotational speed Nm of the motor 2. Here, the d-axis current candidate value Id** is a candidate value for the d-axis current command value Id*; and the q-axis current candidate value Iq** is a candidate value for the q-axis current command value Iq*.

Moreover, in step S110, the current command value calculator 29 further calculates, by referring to a torque-warming-up current map created in advance, both a d-axis warming-up current candidate value Id* and a q-axis warming-up current candidate value Iq*. Here, the d-axis warming-up current candidate value Id*** is another candidate value for the d-axis current command value Id*; and the q-axis warming-up current candidate value Iq*** is another candidate value for the q-axis current command value Iq*. As will be described later, the d-axis warming-up current candidate value Id* and the q-axis warming-up current candidate value Iq* are used for warming up the cooling system 50. More precisely, these values are used for heating the coolant circulating in the circulating flow passage 10 of the cooling system 50.

In addition, both the torque-current map and the torque-warming-up current map are created in advance based on the results of a numerical analysis and real-machine verification. It should be noted that these maps may be suitably changed depending on the specification of a motor actually used.

In step S120, the current command value calculator 29 determines whether the coolant temperature Tr is higher than a predetermined threshold temperature Trth.

If the determination in step S120 results in a "YES" answer, i.e., if the coolant temperature Tr is determined to be higher than the predetermined threshold temperature Trth, then the process proceeds to step S130.

In step S130, the current command value calculator 29 sets the d-axis current command value Id* to the d-axis current candidate value Id**, and sets the q-axis current command value Iq* to the q-axis current candidate value Iq**.

On the other hand, if the determination in step S120 results in a "NO" answer, i.e., if the coolant temperature Tr is determined to be lower than or equal to the predetermined threshold temperature Trth, then the process proceeds to step S140.

In step S140, the current command value calculator 29 sets the d-axis current command value Id* to the d-axis warming-up current candidate value Id***, and sets the q-axis current command value Iq* to the q-axis warming-up current candidate value Iq***.

In step S150, the current command value calculator 29 outputs both the d-axis and q-axis current command values Id* and Iq* of the motor 2 to the current controller 16.

In step S160, the current controller 16 outputs PWM signals (i.e., the control signals) so as to bring the actual d-axis and q-axis currents Id and Iq of the motor 2 respectively into agreement with the d-axis and q-axis current command values Id* and Iq*. In addition, the current controller 16 performs a feedback control such as a PI control or PID control.

After step S160, the motor control process is terminated.

In the present embodiment, the d-axis warming-up current candidate value Id* is set to be larger than the d-axis current candidate value Id. On the other hand, the q-axis warming-up current candidate value Iq* is set to be substantially equal to the q-axis current candidate value Iq. Therefore, when the d-axis and q-axis current command values Id* and Iq* are set respectively to the d-axis and q-axis warming-up current candidate values Id* and Iq* and the PWM signals are outputted so as to bring the actual d-axis and q-axis currents Id and Iq of the motor 2 respectively into agreement with the d-axis and q-axis current command values Id* and Iq*, the phase currents of the inverter 1 and the motor 2 will increase, thereby increasing the amount of heat generated in the inverter 1 and the motor 2. Consequently, the coolant circulating in the circulating flow passage 10 of the cooling system 50 can be heated by both the inverter 1 at the second cooler 7 and the motor 2 at the first cooler 3. Moreover, since the q-axis warming-up current candidate value Iq* and the q-axis current candidate value Iq, which influence the torque, are set to be substantially equal to each other, the output torque of the motor 2 as a result of the feedback control can be prevented from considerably deviating from the torque command value Tm*.

In addition, in the present embodiment, the d-axis current command value Id* corresponds to the d-axis current target value in the claims; the q-axis current command value Iq* corresponds to the q-axis current target value in the claims; and the actual d-axis and q-axis currents Id and Iq of the motor 2 respectively correspond to the d-axis and q-axis currents in the claims.

According to the present embodiment, it is possible to achieve the following advantageous effects.

In the present embodiment, the cooling system 50 is provided to cool the electric drive system 6. The electric drive system 6 includes the motor 2 and the inverter 1 configured to drive the motor 2. The cooling system 50 includes the first cooler 3, the second cooler 7, the circulating flow passage 10 and the pump 12. The first cooler 3 is configured to cool the motor 2 by heat exchange using the coolant flowing through the first cooler 3. The second cooler 7 is configured to cool the inverter 1 by heat exchange using the coolant flowing through the second cooler 7. The circulating flow passage 10 passes through both the first and second coolers 3 and 7, and the coolant circulates in the circulating flow passage 10. The pump 12 is arranged in the circulating flow passage 10 to pump the coolant.

With the above configuration of the cooling system 50, both the motor 2 and the inverter 1 can be cooled by the same coolant circulating in the circulating flow passage 10. Consequently, it becomes possible to reduce the weights of the flow passage and the coolant and thereby suppress increase in the weight of the entire cooling system 50 as compared with a cooling system where two coolant flow passages are separately formed to respectively cool a motor and an inverter.

Moreover, in the present embodiment, the inverter 1 includes the switching elements 5. The cooling system 50 further includes the temperature sensor 18 and the inverter controller 30. The temperature sensor 18 is configured to detect the coolant temperature Tr which is the temperature of the coolant circulating in the circulating flow passage 10. The inverter controller 30 is configured to output the control signals to the switching elements 5 of the inverter 1 according to the torque command value Tm* (or the target torque of the motor 2) and thereby control the output electric power of the inverter 1. When the coolant temperature Tr detected by the temperature sensor 18 is lower than or equal to the predetermined threshold temperature Trth, the inverter controller 30 outputs the control signals and thereby controls the switching elements 5 so as to increase, with variation in the output torque of the motor 2 with respect to the torque command value Tm* kept within a predetermined variation range, both the amount of heat generated by the motor 2 (or the loss occurring in the motor 2) and the amount of heat generated by the inverter 1 (or the loss occurring in the inverter 1). More specifically, the inverter controller 30 is configured to: (a) acquire the actual d-axis and q-axis currents Id and Iq that are converted from the U-phase, V-phase and W-phase currents Iu, Iv and Iw detected by the current sensor 19; (b) acquire the rotational speed Nm of the motor 2 from the rotational speed sensor 20; (c) calculate, based on both the torque command value Tm* and the rotational speed Nm, the d-axis current candidate value Id** that is a candidate value for the d-axis current command value Id*, the d-axis warming-up current candidate value Id*, the q-axis current candidate value Iq that is a candidate value for the q-axis current command value Iq*, and the q-axis warming-up current candidate value Iq*; (d) determine whether the coolant temperature Tr detected by the temperature sensor 18** is lower than or equal to the predetermined threshold temperature Trth; (e) set the d-axis and q-axis current command values Id* and Iq* respectively to the d-axis and q-axis current candidate values Id and Iq when the coolant temperature Tr is determined to be higher than the predetermined threshold temperature Trth; (f) set the d-axis and q-axis current command values Id* and Iq* respectively to the d-axis and q-axis warming-up current candidate values Id* and Iq* when the coolant temperature Tr is determined to be lower than or equal to the predetermined threshold temperature Trth; and (g) set the control signals so as to bring the actual d-axis and q-axis currents Id and Iq of the motor 2 respectively into agreement with the d-axis and q-axis current command values Id* and Iq*. Moreover, the d-axis warming-up current candidate value Id* is larger than the d-axis current candidate value Id. The difference between the d-axis warming-up current candidate value Id* and the d-axis current candidate value Id is larger than the difference between the q-axis warming-up current candidate value Iq* and the q-axis current candidate value Iq.

With the above configuration, when the coolant temperature Tr is lower than or equal to the predetermined threshold temperature Trth, it is possible to increase both the amount of heat generated by the motor 2 and the amount of heat generated by the inverter 1 while keeping the output torque of the motor 2 close to the torque command value Tm*. Consequently, it is possible to lower the viscosity of the coolant and thereby secure the flow rate of the coolant even at low temperatures. As a result, it is possible to suppress increase in the size of the pump 12; it is also possible to prevent the output torque of the motor 2 from considerably deviating from the torque command value Tm*, thereby suppressing an uncomfortable feeling caused to a user of the eVTOL.

While the above particular embodiment has been shown and described, it will be understood by those skilled in the art that various modifications, changes and improvements may be made without departing from the spirit of the present disclosure.

For example, in the above-described embodiment, each of the switching elements 5 of the inverter 1 is implemented by an IGBT. However, each of the switching elements 5 of the inverter 1 may alternatively be implemented by a wide-bandgap element such as SiC (Silicon Carbide) or GaN (Gallium Nitride). Wide-bandgap elements have a lower loss and a higher heatproof temperature than a conventional switching element formed of Si. With the use of wide-bandgap elements, the heatproof temperature of the switching elements 5 would be improved, for example, from the conventional range of 150° C.-175° C. to a maximum of 250° C. Consequently, the heat resistance of the inverter 1 would be improved, thereby making it possible to maintain or improve the output of the electric drive system 6.

In the above-described embodiment, the cooling system 50 includes the heat exchanger 14. However, the heat exchanger 14 may be omitted from the cooling system 50, thereby simplifying the configuration of the cooling system 50.

In the above-described embodiment, the cooling system 50 includes the temperature sensor 18 as a component thereof. Alternatively, the temperature sensor 18 may be implemented by a temperature sensor that is included in a different system from the cooling system 50.

In the above-described embodiment, when the coolant temperature Tr detected by the temperature sensor 18 is lower than or equal to the predetermined threshold temperature Trth, the inverter controller 30 outputs the control signals and thereby controls the switching elements 5 so as to increase, with variation in the output torque of the motor 2 with respect to the torque command value Tm* kept within the predetermined variation range, both the amount of heat generated by the motor 2 and the amount of heat generated by the inverter 1. Alternatively, the inverter controller 30 may output, regardless of the coolant temperature Tr detected by the temperature sensor 18, the control signals and thereby control the switching elements 5 so as to increase, with variation in the output torque of the motor 2 with respect to the torque command value Tm* kept within the predetermined variation range, both the amount of heat generated by the motor 2 and the amount of heat generated by the inverter 1.

In the above-described embodiment, the q-axis warming-up current candidate value Iq* is substantially equal to the q-axis current candidate value Iq. Alternatively, the q-axis warming-up current candidate value Iq* may not be substantially equal to the q-axis current candidate value Iq. For example, the difference between the q-axis warming-up current candidate value Iq* and the q-axis current candidate value Iq may be set so that variation in the output torque of the motor 2 is within a range not causing an uncomfortable feeling to a user (or occupant) of the eVTOL. More specifically, the difference between the q-axis warming-up current candidate value Iq* and the q-axis current candidate value Iq may be set to be smaller than the difference between the d-axis warming-up current candidate value Id* and the d-axis current candidate value Id. In addition, the difference between the q-axis warming-up current candidate value Iq* and the q-axis current candidate value Iq may be or may not be an absolute value. In other words, the absolute value of the difference between the q-axis warming-up current candidate value Iq* and the q-axis current candidate value Iq may be set to be smaller than the difference between the d-axis warming-up current candidate value Id* and the d-axis current candidate value Id.

What is claimed is:

1. A cooling system for cooling an electric drive system, the electric drive system comprising a motor and an inverter configured to drive the motor, the inverter comprising switching elements, the cooling system comprising:
a first cooler configured to cool the motor by heat exchange using a coolant flowing through the first cooler;
a second cooler configured to cool the inverter by heat exchange using the coolant flowing through the second cooler;
a circulating flow passage which passes through both the first and second coolers and in which the coolant circulates;
a pump arranged in the circulating flow passage to pump the coolant;
an inverter controller configured to output control signals to the switching elements according to a target torque of the motor and thereby control an output electric power of the inverter; and
a temperature sensor configured to detect a coolant temperature, the coolant temperature being a temperature of the coolant circulating in the circulating flow passage,
wherein
when the coolant temperature detected by the temperature sensor is lower than or equal to a predetermined threshold temperature, the inverter controller outputs the control signals and thereby controls the switching elements so as to increase, with variation in an output torque of the motor with respect to the target torque kept within a predetermined variation range, both an amount of heat generated by the motor and an amount of heat generated by the inverter,
wherein
the inverter controller is configured to:
acquire a motor current, which is electric current flowing through the motor and composed of a d-axis current and a q-axis current, from a current sensor that detects the motor current;
acquire a rotational speed of the motor from a rotational speed sensor that detects the rotational speed;
calculate, based on both the target torque and the acquired rotational speed, a d-axis current candidate value that is a candidate value for a d-axis current target value, a d-axis warming-up current candidate value, a q-axis current candidate value that is a candidate value for a q-axis current target value, and a q-axis warming-up current candidate value;
determine whether the coolant temperature detected by the temperature sensor is lower than or equal to the predetermined threshold temperature;
set the d-axis and q-axis current target values respectively to the d-axis and q-axis current candidate values when the coolant temperature is determined to be higher than the predetermined threshold temperature;
set the d-axis and q-axis current target values respectively to the d-axis and q-axis warming-up current candidate values when the coolant temperature is determined to be lower than or equal to the predetermined threshold temperature; and set the control signals so as to bring the d-axis and q-axis currents respectively into agreement with the d-axis and q-axis current target values, wherein the d-axis warming-up current candidate value is larger than the d-axis current candidate value, and a difference between the d-axis warming-up current candidate value and the d-axis current candidate value is larger than a difference between the q-axis warming-up current candidate value and the q-axis current candidate value.

2. The cooling system as set forth in claim 1, wherein each of the switching elements of the inverter is constituted of a wide-bandgap element.

* * * * *